United States Patent
Gardner et al.

(10) Patent No.: US 6,380,055 B2
(45) Date of Patent: *Apr. 30, 2002

(54) DOPANT DIFFUSION-RETARDING BARRIER REGION FORMED WITHIN POLYSILICON GATE LAYER

(75) Inventors: Mark I. Gardner, Cedar Creek; Robert Dawson, Austin; H. Jim Fulford, Jr., Austin; Frederick N. Hause, Austin; Mark W. Michael, Cedar Park; Bradley T. Moore; Derick J. Wristers, both of Austin, all of TX (US)

(73) Assignee: Advanced Micro Devices, Inc., Sunnyvale, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/177,043

(22) Filed: Oct. 22, 1998

(51) Int. Cl.$^7$ .................. H01L 21/3205; H01L 21/38
(52) U.S. Cl. .................. 438/585; 438/560; 438/592
(58) Field of Search ................ 438/585, 592, 438/560

(56) References Cited

U.S. PATENT DOCUMENTS

| 4,369,072 A | 1/1983 | Bakeman, Jr. et al. ....... 148/1.5 |
| 4,420,872 A | 12/1983 | Solo de Zaldivar ........... 29/571 |
| 4,481,527 A | 11/1984 | Chen et al. ................. 357/23 |

(List continued on next page.)

OTHER PUBLICATIONS

T. Kuroi et al., "Novel NICE (Nitrogen Implantation into CMOS Gate Electrode and Source–Drain) Structure for High Reliability and High Performance 0.25 μm Dual gate CMOS," International Electron Devices Meeting Technical Digest, Dec. 5–8, 1993, Washington, D.C., pp. 325–328.

H. Sayama et al, "Low Voltage of Sub–Quarter Micron W–Polycide Dual Gate CMOS with Non–Uniformly Doped Channel," International Electron Devices Meeting Technical Digest, Dec. 8–11, 1996, San Francisco, CA, pp. 583–586.

(List continued on next page.)

Primary Examiner—Alexander G. Ghyka
(74) Attorney, Agent, or Firm—Skjerven Morrill MacPherson LLP (57) ABSTRACT

A diffusion-retarding barrier region is incorporated into the gate electrode to reduce the downward diffusion of dopant toward the gate dielectric. The barrier region is a nitrogen-containing diffusion retarding barrier region formed between two separately formed layers of polysilicon. The upper layer of polysilicon is doped more heavily than the lower layer of polysilicon, and the barrier region serves to keep most of the dopant within the upper layer of polysilicon, and yet may allow some of the dopant to diffuse into the lower layer of polysilicon. The barrier region may be formed, for example, by annealing the first polysilicon layer in an nitrogen-containing ambient to form a nitrided layer at the top surface of the first polysilicon layer. The barrier region may alternatively be formed by depositing a nitrogen-containing layer, such as a silicon nitride or titanium nitride layer, on the top surface of the first polysilicon layer. The thickness of the nitrogen-containing layer is preferably approximately 5–15 Å thick. Any nitrogen residing at the top of the gate dielectric may be kept to a concentration less than approximately 2%. The present invention is particularly well suited to thin gate dielectrics, such as a those having a thickness of approximately 25–60 Å, when using a p-type dopant, such as boron.

12 Claims, 3 Drawing Sheets

U.S. PATENT DOCUMENTS

| | | | | |
|---|---|---|---|---|
| 4,575,921 A | * | 3/1986 | Bhagat | 29/571 |
| 4,597,159 A | * | 7/1986 | Usami et al. | 29/571 |
| 4,623,912 A | | 11/1986 | Chang et al. | 357/54 |
| 4,774,197 A | | 9/1988 | Haddad et al. | 437/27 |
| 4,869,781 A | | 9/1989 | Euen et al. | 156/643 |
| 4,897,368 A | | 1/1990 | Kobushi et al. | 437/200 |
| 5,219,773 A | | 6/1993 | Dunn | 437/42 |
| 5,234,960 A | | 6/1994 | Pfiester et al. | 257/67 |
| 5,436,481 A | | 7/1995 | Egawa et al. | 257/324 |
| 5,514,902 A | | 5/1996 | Kawasaki et al. | 257/607 |
| 5,518,958 A | | 5/1996 | Giewont et al. | 437/186 |
| 5,567,638 A | * | 10/1996 | Lin et al. | 437/46 |
| 5,605,848 A | | 2/1997 | Ngaoram | 437/24 |
| 5,668,028 A | | 9/1997 | Bryant | 438/287 |
| 5,744,845 A | | 4/1998 | Sayama et al. | 257/371 |
| 5,872,376 A | * | 2/1999 | Gardner et al. | 257/336 |
| 5,879,975 A | | 3/1999 | Karlsson et al. | 438/162 |
| 5,945,904 A | | 10/1999 | Hu | 257/412 |
| 5,977,561 A | | 11/1999 | Wu | 257/67 |
| 5,998,271 A | | 12/1999 | Schwalke | 438/301 |
| 5,885,877 A | * | 3/2000 | Gardner et al. | 438/300 |
| 6,040,207 A | | 3/2000 | Gardner et al. | 438/216 |

OTHER PUBLICATIONS

H. Fang, et al., "Low Temperature Furnace–Grown Reoxidized Nitrided Oxide Gate Dielectrics as a Barrier to Boron Penetration," IEEE Electron Device Letters, vol. 13, No. 4, Apr. 1992, pp. 217–219.

A. B. Joshi, J. Ahn and D. L. Kwong; "Oxynitride Gate Dielectrics for p+–Polysilicon Gate MOS Devices," *IEEE Electron Devices Letters*, vol. 14, No. 12, Dec. 1993, pp. 560–562.

Chuan Lin et al., "Leakage Current, Reliability Characteristics, and Boron Penetration Of Ultra–Thin (32–36Å) $O_2$ Oxides and $N_2O/NO$ Oxynitrides," *International Electron Devices Meeting Technical Digest*, Dec. 8–11, 1996, San Francisco, CA, pp. 331–334.

E. Hasegawa et al., "The Impact of Nitrogen Profile Engineering on Ultra–Thin Nitride Oxide Films for Dual–Gate CMOS ULSI," *International Electron Devices Meeting Technical Digest*, Dec. 10–13, 1995, Washington, DC, pp. 327–330.

S.V. Hattangady, H. Niimi, and G. Lucovsky, "Controlled Nitrogen Incorporated at the Gate Oxide Surface," *Applied Physics Letters*, vol. 66, No. 25, Jun. 19, 1995, pp. 3495–3497.

Stanley Wolf and Richard N. Tauber, *Silicon Processing for the VLSI Era, Vol. 1: Process Technology*, Lattice Press, Sunset Beach, California, 1986, pp. 182–195, 209–211, 280–283, 294, 308, 321–327.

C. T. Liu et al, "High Performance $0.2\mu$ CMOS with 25 Å Gate Oxide Grown on Nitrogen Implanted Si Substrates," *International Electron Devices Meeting Technical Digest*, San Francisco, California, Dec. 8–11, 1996, pp. 499–502.

C. T. Liu et al., "25 Å Gate Oxide without Boron Penetration for 0.25 and $0.3-\mu$ PMOSFETs," *1996 Symposium on VSLI Technology Digest of Technical Papers*, pp. 18–19.

Stanley Wolf, *Silicon Processing for the VSLI Era, vol. 2: Process Integration*, Lattice Press, Sunset Beach, California, 1990, pp. 124–131.

Stanley Wolf, *Silicon Processing for the VSLI Era, vol. 3: The Submicron MOSFET*, Lattice Press, Sunset Beach, California, 1995, pp. 305–313, 496–504, 641–642 and 648–661.

Hattangady, et al., "Ultrathin Nitrogen–Profile Engineered Gate Dielectric Films," *Internationa; Electron Devices Meeting Technical Digest 1996*, Dec. 8–11, 1996, San Francisco, California, pp. 495–498.

* cited by examiner

DOPANT DIFFUSION-RETARDING BARRIER REGION FORMED WITHIN POLYSILICON GATE LAYER

CROSS-REFERENCE TO RELATED APPLICATIONS

This patent document is related to the following commonly-assigned, U.S. patent applications, which are each incorporated herein by reference in its entirety:

U.S. patent application Ser. No. 09/086,296, entitled "COMPOSITE GATE DIELECTRIC LAYER INCORPORATING DOPANT DIFFUSION-RETARDING BARRIER LAYER," naming as inventors Mark I. Gardner, Robert Dawson, H. Jim Fulford, Jr., Frederick N. Hause, Mark W. Michael, Bradley T. Moore, and Derick J. Wristers;

U.S. patent application Ser. No. 08/837,581, now U.S. Pat. No. 5,885,877 entitled "COMPOSITE GATE ELECTRODE INCORPORATING DOPANT DIFFUSION-RETARDING BARRIER LAYER ADJACENT TO UNDERLYING GATE DIELECTRIC," naming as inventors Mark I. Gardner, Robert Dawson, H. Jim Fulford, Jr., Frederick N. Hause, Mark W. Michael, Bradley T. Moore, and Derick J. Wristers; and U.S. patent application Ser. No. 09/086,050, entitled "MULTI-LAYER GATE ELECTRODE INCORPORATING DOPANT DIFFUSION-RETARDING BARRIER LAYER," naming as inventors Mark I. Gardner, Jon Cheek, Robert Dawson, H. Jim Fulford, Jr., Frederick N. Hause, Mark W. Michael, Bradley T. Moore, Thomas E. Spikes, Jr. and Derick J. Wristers.

BACKGROUND OF THE INVENTION

1. Field of the Invention

The present invention is related to the manufacture of insulated gate field effect transistors, and more particularly to the structure and doping of gate electrode structures therein.

2. Description of the Related Art

An insulated-gate field-effect transistor (IGFET), such as a metal-oxide semiconductor field-effect transistor (MOSFET), uses a gate electrode to control an underlying surface channel joining a source and a drain. The channel, drain and source are located in a semiconductor substrate, with the channel being doped oppositely to the drain and source. The gate electrode is separated from the semiconductor substrate by a thin insulating layer (i.e., a gate dielectric layer) such as an oxide. The operation of the IGFET involves application of an input voltage to the gate electrode, which sets up a transverse electric field in the channel in order to modulate the longitudinal conductance of the channel.

In typical IGFET processing, the source and drain are formed by introducing dopants of a second conductivity type (P or N) into the semiconductor substrate of a first conductivity type (N or P) using a patterned gate electrode as a mask. This self-aligning procedure tends to improve packing density and reduce parasitic overlap capacitances between the gate electrode and the source/drain regions. Polysilicon (also called polycrystalline silicon, poly-Si, or just "poly") thin films are typically used as the gate electrode. Since polysilicon has the same high melting point as a silicon substrate, it can be deposited prior to source and drain formation. The polysilicon is anisotropically etched through openings in a photoresist mask to provide a gate electrode which forms a mask during formation of the source and drain by ion implantation. Photolithography is used to create patterns in the photoresist mask that define the gate electrode.

The gate electrode is typically doped by the same type of ion implantation as are the source and drain. For example, boron is frequently implanted to form the source and drain in a P-channel IGFET, and the boron is also implanted into the gate electrode of the IGFET to create a P-type polysilicon gate electrode. However, because boron is such a "light" atom (i.e., low atomic mass), boron implanted into the polysilicon gate electrode can easily diffuse along the grain boundaries of the polysilicon and into the gate oxide, and may diffuse ultimately into the underlying channel region. The presence of boron in the channel affects the device parameters of the IGFET, especially the threshold voltage, and the presence of boron in the gate oxide can affect the reliability of the IGFET. Both effects are tremendously undesirable.

A number of techniques have been utilized to reduce diffusion of dopants, especially boron, into the gate dielectric and into the underlying channel. One such method is disclosed by Fang, et al, in a paper entitled "Low-Temperature Furnace-Grown Reoxidized Nitrided Oxide Gate Dielectrics as a Barrier to Boron Penetration," *IEEE Electron Device Letters*, Vol. 13, No. 4, April, 1992, which includes a nitridation of a partially grown gate oxide, followed by an additional oxidation step. Polysilicon is then deposited on the reoxidized nitrided oxide and etched to form gate electrodes.

Other similar methods are disclosed by Joshi, et al in a paper entitled "Oxynitride Gate Dielectrics for P+-polysilicon Gate MOS Devices," *IEEE Electron Device Letters*, Vol. 14, No. 12, December, 1993, which compares several similar methods of forming oxynitride gate dielectrics.

While such methods are helpful in reducing boron penetration into the channel, the desired gate oxide thickness continues to decrease. The effectiveness of earlier techniques may diminish with decreasing gate oxide thickness. Accordingly, there is a need for improved techniques for reducing dopant penetration (especially boron) into the gate oxide and into the channel region.

SUMMARY OF THE INVENTION

The present invention improves upon the previous techniques for retarding dopant diffusion into the gate dielectric by incorporating a diffusion barrier region within a layer of polysilicon. The barrier region is a nitrogen-containing, diffusion-retarding barrier region. The portion of the polysilicon layer above the barrier region is doped more heavily than the portion below, and the barrier region serves to keep most of the dopant within the upper portion. The barrier region nevertheless allows some of the dopant to diff-use into the lower portion, which ensures that the polysilicon layer forms a gate electrode which is a single contiguous electrical node rather than an insulating portion due to polysilicon depletion effects.

The barrier region is formed by implanting a nitrogen-containing material, such as elemental nitrogen or molecular nitrogen, so that a region is formed within the polysilicon layer. The thickness of the nitrogen-containing region may be chosen for its ability to conduct current therethrough while retaining its ability to retard dopant diffusion, and may be chosen to be approximately 5–15 Å thick.

By use of this invention, any nitrogen residing at the top of the gate dielectric may be kept to a concentration less than approximately 2%. The dopant concentration at the first polysilicon layer bottom surface may exceed approximately $1 \times 10^{21}$ atoms/cm$^3$. The present invention is particularly well suited to thin gate dielectrics, such as a those having a thickness less than approximately 60 Å when using a p-type dopant, such as B, BF$_2$, and other similar compounds of boron and flourine (e.g., BF$_x$).

In one embodiment for a semiconductor manufacturing process, a method of fabricating a gate electrode structure for an insulated gate field effect transistor includes the steps of: (1) forming a polysilicon layer on an underlying gate dielectric layer, the polysilicon layer having top and bottom surfaces, the bottom surface forming an interface with said gate dielectric layer; (2) implanting a nitrogen-containing material to form a nitrogen-containing diffusion-retarding barrier region within the polysilicon layer; (3) introducing a dopant into at least a portion of the polysilicon layer disposed between the barrier region and the top surface, resulting in a greater dopant concentration immediately above the barrier region than immediately below; and (4) removing regions of the polysilicon layer to form a gate electrode for the IGFET.

In another embodiment, the method includes the additional step of implanting a nitrogen-containing material to form a second nitrogen-containing diffusion-retarding barrier region above and spaced apart from the first nitrogen-containing diffusion-retarding barrier region.

In yet another embodiment of the present invention, a semiconductor gate electrode structure for an insulated gate field effect transistor includes: (1) a polysilicon layer formed on an underlying gate dielectric layer, the polysilicon layer having respective top and bottom surfaces, the bottom surface forming an interface with said gate dielectric layer; (2) a first nitrogen-containing diffusion-retarding barrier region formed within the polysilicon layer; and (3) a dopant within the polysilicon layer having a greater dopant concentration immediately above the diffusion barrier region than immediately below.

BRIEF DESCRIPTION OF THE DRAWINGS

The present invention may be better understood, and its numerous objects, features, and advantages made apparent to those skilled in the art by referencing the accompanying drawings.

In the drawings, depicted elements are not necessarily drawn to scale, and like or similar elements may be designated by the same reference numeral throughout the several views.

DESCRIPTION OF THE PREFERRED EMBODIMENT(S)

Figure 1A:
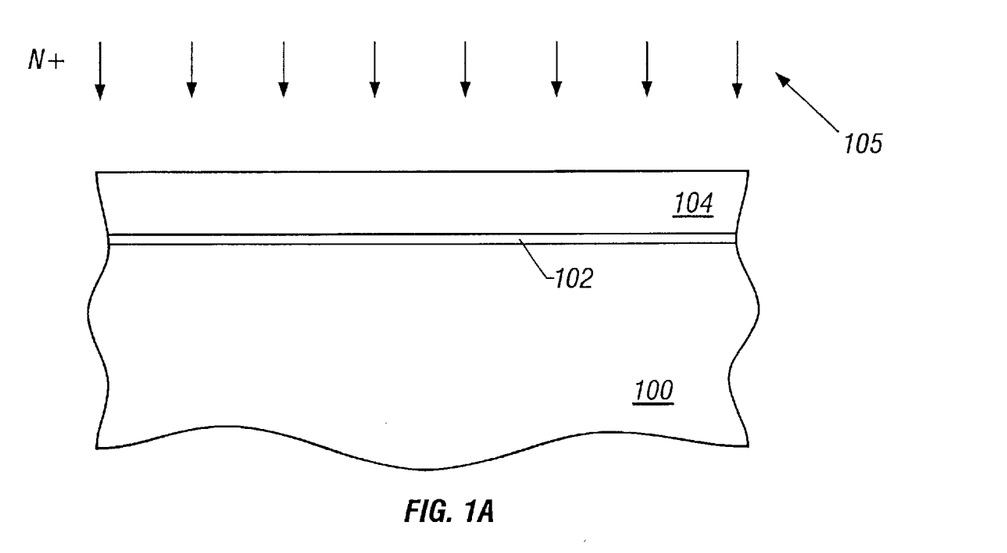
FIGS. 1A–1D are cross-sectional views illustrating a semiconductor process flow in accordance with the present invention.

FIGS. 1A–1D show cross-sectional views of successive process steps for forming a gate electrode in accordance with a first embodiment of the present invention. In FIG. 1A, a layer of polysilicon 104 is shown disposed upon a gate dielectric 102, which in turn is disposed on a semiconductor substrate 100 suitable for integrated circuit manufacture. For example, substrate 100 includes a phosphorus-doped N-well formed in a P-type planar epitaxial surface layer (not shown) with a <100>orientation and a resistivity of 12 ohm-cm. Preferably, the epitaxial surface layer is disposed on a P+ base layer (not shown). A blanket layer of gate dielectric 102 (e.g., silicon dioxide, silicon oxynitride, nitrided silicon dioxide, etc.) is formed on the top surface of substrate 100 preferably using tube growth at a temperature of 700–1,000° C. in an O$_2$ containing ambient. Gate dielectric 102 has a preferred thickness in the range of 25 to 200 Å. Thereafter, a first layer of polysilicon 104 preferably is deposited by low pressure chemical vapor deposition (LPCVD) on the top surface of the gate dielectric 102. Polysilicon 104 is deposited undoped and has a preferred thickness in the range of 100–300 Å.

Figure 1B:
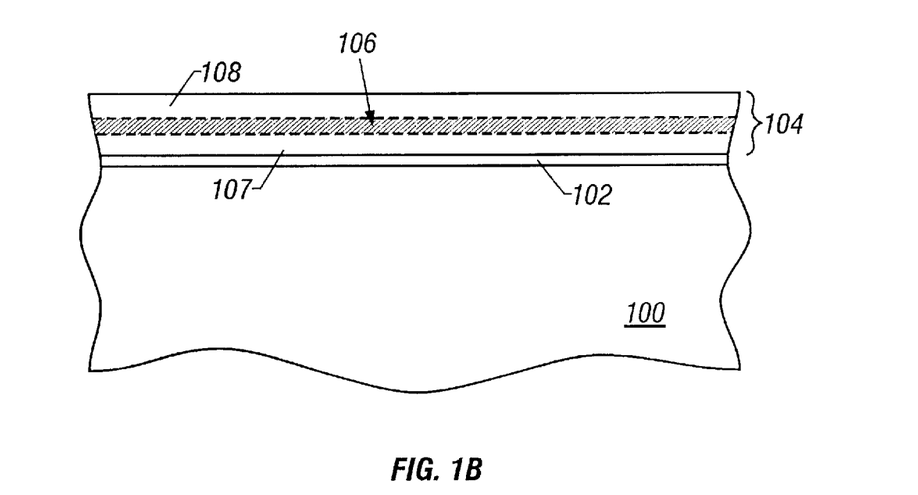

Continuing with this exemplary process sequence, a nitrogen implant 105 is performed to create a nitrogen barrier region 106 within the polysilicon 104. For example, elemental nitrogen (N) may be implanted using an energy of 5–30 keV and at a dose of $5 \times 10^{14}$–$5 \times 10^{15}$ atoms/cm$^2$. Alternatively, molecular nitrogen (N$_2$) may also be implanted using an energy of 10–60 keV and at a dose of $5 \times 10^{14}$–$5 \times 10^{15}$ atoms/cm$^2$. An anneal may optionally follow the nitrogen implant. Such an anneal may be performed using a rapid thermal processing (RTP) step, using a tube anneal, or other similar methods. For example, an RTP anneal may be performed for a time in the range of 10–60 seconds at a temperature in the range of 900–1050° C. The resulting structure is shown in FIG. 1B. An upper portion 108 of polysilicon layer 104 is shown disposed between the barrier region 106 and the top surface of the polysilicon 104. A lower portion 107 of polysilicon layer 104 is shown disposed between the barrier region 106 and the bottom surface of the polysilicon 104 (at the interface with the gate dielectric 102). The polysilicon 104 is formed with a thickness in the range of 300–2500 Å.

A photoresist layer (not shown) is next applied and a gate mask used to image the gate electrode features into the photoresist. The polysilicon region 108, barrier region 106, and polysilicon region 107 are then anisotropically etched to define a gate electrode 120. A light dose of a first dopant (e.g., boron) is implanted into the semiconductor substrate 100 to provide a lightly doped source region 110 and a lightly doped drain region 112. The first dopant is also implanted into the gate electrode 120 wherein the polysilicon 108 is lightly doped. For instance, the structure is subjected to ion implantation of boron at a dose in the range of $5 \times 10^{13}$ to $1 \times 10^{14}$ atoms/cm$^2$ and an energy in the range of 2 to 80 kiloelectron-volts. As a result, the lightly doped source region 110 and the lightly doped drain region 112, both substantially aligned with the gate electrode 120, are formed at and below the surface of substrate 100. Lightly doped source and drain regions 110, 112, respectively, are doped P− with a dopant concentration in the range of about $5 \times 10^{17}$ to $5 \times 10^{18}$ atoms/cm$^3$, and a junction depth in the range of 0.01 to 0.15 μ.

Figure 1C:
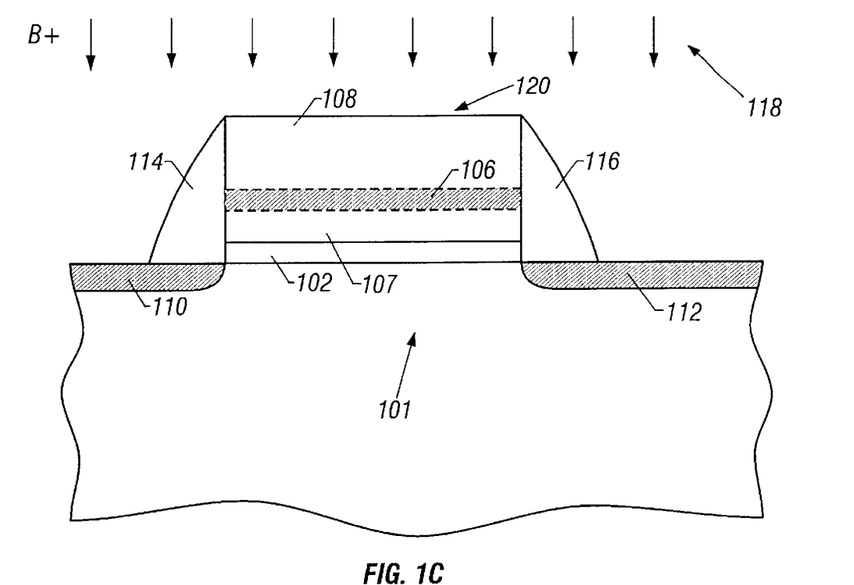

Spacers 114, 116 are then formed at the edges of the gate electrode 120. The resulting structure is shown in FIG. 1C, which shows spacers 114, 116 formed adjacent to the gate electrode 120, and shows lightly-doped source region 110 and lightly-doped drain region 112 formed within the substrate 100.

Figure 1D:
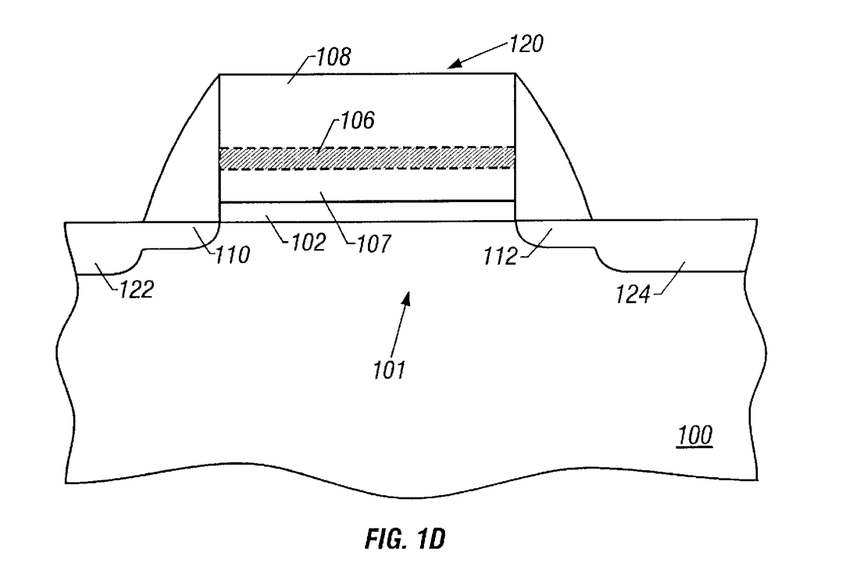

Continuing with the process sequence, a boron implant 118 is next performed o form P+ regions in both source and drain regions. The resulting structure is shown in FIG. 1D, which shows P+ source region 122 and P+ drain region 124 formed within the substrate 100 and outward of the spacers 114, 116, as is well known in the art. For example, the boron implant 118 may be performed at a dose in the range of $2.0 \times 10^{15}$ to $8.0 \times 10^{15}$ atoms/cm$^2$ and an energy in the range of 2 to 20 kiloelectron-volts. As a result, the heavily doped source region 122 and the heavily doped drain region 124, both substantially aligned with the spacers 114, 116, are formed at and below the surface of substrate 100. Heavily doped source and drain regions 122, 124, respectively, are doped P+ with a dopant concentration in the range of about $5 \times 10^{19}$ to $5 \times 10^{20}$ atoms/cm$^3$, and a junction depth in the range of 0.01 to 0.1 $\mu$. The presence of spacers 114, 116 and the gate electrode 120 serve to prevent the boron implant from reaching the channel 101 underlying the gate electrode 120 and from reaching the lightly doped source and drain regions 110, 112.

Further processing steps in the fabrication of IGFETs typically include forming a thick oxide layer over the active regions, forming contact windows in the oxide layer above the drain, source and gate electrode, forming appropriate interconnect metallization in the contact windows, and forming a passivation layer. These further processing steps are conventional and need not be repeated herein. Likewise the principal processing steps disclosed herein may be combined with other steps readily apparent to those skilled in the art.

Figure 2:
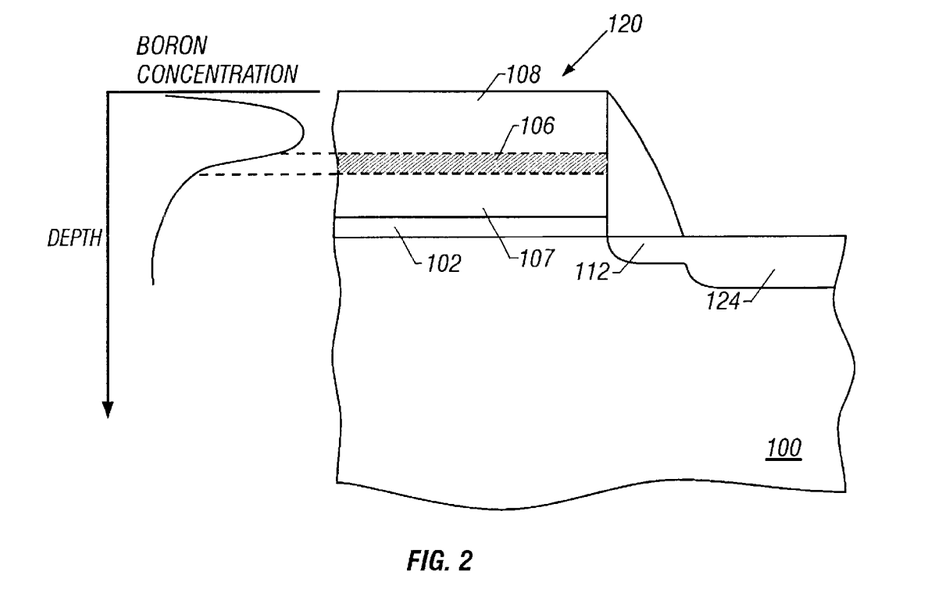
FIG. 2 is a cross-sectional view illustrating a doping profile associated with the process flow depicted in FIGS. 1A–1D.

The preferred doping profile within the gate electrode 120 as a result of the boron implant 118 is shown in FIG. 2. The bulk of the dopant is implanted into the polysilicon region 108, which is above the barrier region 106. Only a small amount of the dopant is preferably implanted into the region of the barrier region 106 or into the polysilicon region 107 layer below the barrier region 106. Through subsequent heat treatment operations (e.g., implant anneal steps) the barrier region 106 retards the downward diffusion of the boron and helps prevent boron from reaching the gate dielectric 102/polysilicon 104 interface. Alternatively, the dopant profile may exist entirely within the upper layer of polysilicon 108. In either case, the barrier region 106 retards the downward diffusion of dopant toward the gate dielectric 102 and toward the channel region 101.

In another embodiment generally following the sequence depicted in FIGS. 1A–1D, the barrier region 106 may be formed by depositing a nitrogen-containing layer, such as silicon nitride or titanium nitride, onto the top surface of polysilicon 104. Suitable conditions for depositing a layer of silicon nitride are low pressure chemical vapor deposition (LPCVD), plasma deposition and deposition by sputtering. Suitable conditions for depositing a layer of titanium nitride are low pressure chemical vapor deposition, plasma deposition and deposition by sputtering. Such a layer of titanium nitride is electrically conductive and thus helps ensure a good electrical connection between polysilicon region 107 and polysilicon region 108.

Figure 3:
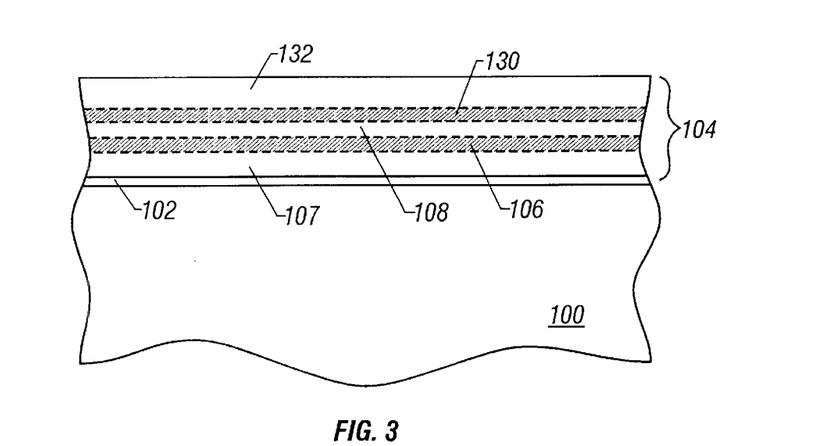
FIG. 3 is a cross-sectional view of a structure incorporating two barrier regions in accordance with another embodiment of the present invention.

FIG. 3 is a cross-sectional view of a multi-layer structure incorporating three polysilicon layers, with a separate barrier region between each adjacent pair of polysilicon layers. A blanket layer of gate dielectric 102 (e.g., silicon dioxide, silicon oxynitride, nitrided silicon dioxide, etc.) is formed on the top surface of substrate 100 as before, preferably to a thickness in the range of 25 to 200 Å. Thereafter, a first layer of polysilicon region 107 is deposited on the top surface of the gate dielectric 102. Polysilicon region 107 is deposited undoped and has a preferred thickness in the range of 100–300 Å.

Continuing with the exemplary process sequence, a first nitrogen anneal is performed to create a nitrogen barrier region 106 on the top surface of the polysilicon region 107. A second layer of polysilicon 108 is then deposited on the top surface of the barrier region 106, preferably to a thickness of 100–300 Å. A second nitrogen anneal is performed to create a second nitrogen barrier region 130 on the top surface of the polysilicon 108. A third layer of polysilicon 132 is then deposited on the top surface of the barrier region 130, preferably to a thickness of 300–2500 Å.

A photoresist layer (not shown) is next applied and a gate mask used to image the gate electrode features into the photoresist. The polysilicon region 132, barrier region 130, polysilicon region 108, barrier region 106, and polysilicon region 107 are then anisotropically etched to define a gate electrode (not shown). Next, LDD regions, spacers, and source/drain regions are formed in a manner similar to that described before. Specifically, a light dose of a first dopant (e.g., boron) is then implanted into the semiconductor substrate 100 to provide a lightly doped source and drain regions (i.e., LDD regions, not shown). This first dopant is also implanted into the undoped polysilicon region 132, possibly also into the undoped polysilicon 108, and possibly into the undoped polysilicon region 107, wherein each is lightly doped. For instance, the structure is subjected to ion implantation of boron at a dose in the range of $5 \times 10^{13}$ to $1 \times 10^{14}$ atoms/cm$^2$ and an energy in the range of 2 to 80 kiloelectron-volts. Spacers are then formed at the edges of the gate electrode as before, followed by a boron implant (not shown) to form P+ regions in both source and drain regions, as before.

Such a multi-layer structure has several additional potential advantages. If, for example, the heavy boron implant is targeted to achieve an implant depth residing within the polysilicon 132, then the barrier region 130 retards some amount of dopant diffusion into the middle polysilicon 108, while the lower barrier region 106 additionally retards the diffusion of dopant already within the polysilicon 108 from reaching the lower layer of polysilicon region 107. In other words, the presence of two barrier regions 130, 106 allows a heavy dopant density within the upper layer of polysilicon 132 but yet reduces the amount of dopant reaching the lower layer of polysilicon 107, and especially reduces the amount of dopant which reaches the polysilicon 107/gate dielectric 102 interface. This is accomplished while keeping the thickness of each barrier region thin enough to allow some amount of dopant diffusion sufficient to "dope" the polysilicon 108 and polysilicon 107 enough to prevent undesirable polysilicon depletion effects which otherwise result when the polysilicon near the gate dielectric interface remains undoped.

Alternatively, the barrier regions may be produced at a sufficient thickness to substantially prevent implanted dopant from diffusing through the barrier regions. A dopant may be implanted into a particular polysilicon layer (e.g., polysilicon 108) and remain substantially "trapped" within that same layer. Other polysilicon layers may be implanted to different dopant densities, or even with a dopant of opposite conductivity type than a dopant already implanted into a different polysilicon layer.

By use of this invention, the gate dielectric may be reduced down to approximately 25 Å, without serious concentration of boron reaching the gate dielectric. Moreover, a sharp doping profile is achieved at the nitrogen barrier region. The doping profile within the polysilicon retains a much sharper profile than is otherwise achievable without using the barrier region techniques disclosed herein.

Additional techniques for dopant implantation into polysilicon gate electrodes are disclosed in copending commonly-assigned application entitled "Ion Implantation Into A Gate Electrode Layer Using An Implant Profile Displacement Layer", naming inventors Mark I. Gardner, Robert Dawson, H. Jim Fulford, Jr., Frederick N. Hause, Mark W. Michael, Bradley T. Moore, and Derick J. Wristers, filed on even date herewith, and having Ser. No. 08/837,579 (Attorney Docket No. M-4000 US), which issed as U.S. Pat. No. 6,080,629, on Jun. 27, 2000, and which application is incorporated by reference herein in its entirety.

Although only a single FET has been shown for purposes of illustration, it is understood that in actual practice, many devices are fabricated on a single semiconductor wafer as widely practiced in the art. Accordingly, the invention is well-suited for use in an integrated circuit chip, as well as an electronic system including a microprocessor, a memory, and a system bus.

Those skilled in the art will readily implement the steps necessary to provide the structures and methods disclosed herein, and will understand that the process parameters, materials, and dimensions are given by way of example only and can be varied to achieve the desired structure as well as modifications which are within the scope of the invention.

In a typical embodiment for a CMOS process the N-channel transistors are processed in like manner as the P-channel transistor discussed above, except that an n-type dopant atom (e.g., arsenic) is implanted to form the N-channel source/drain regions. As is well known in the art, the P-channel transistors may be masked with photoresist during the n-type source/drain implant step, which photoresist serves to prevent the n-type dopant from reaching the N-channel gate, channel, and source/drain regions. Likewise, the p-type implanting step for the P-channel source/drain regions is performed while the N-channel IGFETs are protected. Consequently, barrier regions may be advantageously formed, if desired, only within the gate electrode of P-channel IGFETs which have greater dopant diffusion than N-channel IGFETs.

An IGFET transistor may be conceptualized as having a control terminal which controls the flow of current between a first current handling terminal and a second current handling terminal. Although IGFET transistors are frequently discussed as having a drain, a gate, and a source, in most such devices the drain is interchangeable with the source. This is because the layout and semiconductor processing of the transistor is symmetrical. For an N-channel IGFET transistor, the current handling terminal normally residing at the higher voltage is customarily called the drain. The current handling terminal normally residing at the lower voltage is customarily called the source. A sufficient voltage on the gate (relative to the source voltage) causes a current to therefore flow from the drain to the source. The source-voltage referred to in N-channel IGFET device equations merely refers to whichever drain or source terminal has the lower voltage at any given point in time. For example, the "source" of the N-channel device of a bidirectional CMOS transfer gate depends on which side of the transfer gate is at the lower voltage. To reflect this symmetry of most N-channel IGFET transistors, the control terminal may be deemed the gate, the first current handling terminal may be termed the "drain/source", and the second current handling terminal may be termed the "source/drain". Such a description is equally valid for a P-channel IGFET transistor, since the polarity between drain and source voltages, and the direction of current flow between drain and source, is not implied by such terminology. Alternatively, one current-handling terminal may arbitrarily deemed the "drain" and the other deemed the "source", with an implicit understanding that the two are not distinct, but interchangeable. It should be noted that IGFET transistors are commonly referred to as MOSFET transistors (which literally is an acronym for "Metal-Oxide-Semiconductor Field Effect Transistor"), even though the gate material may be polysilicon or some material other than metal, and the dielectric may be oxynitride, nitride, or some material other than oxide. The casual use of such historical legacy terms as MOSFET should not be interpreted to literally specify a metal gate FET having an oxide dielectric.

While the invention has been largely described with respect to the embodiments set forth above, the invention is not necessarily limited to these embodiments. Variations and modifications of the embodiments disclosed herein may be made based on the description set forth herein, without departing from the scope and spirit of the invention as set forth in the following claims. For example, the invention is not necessarily limited to any particular transistor process technology, or to any particular layer thickness or composition. Moreover, while gate dielectrics are commonly formed of silicon dioxide, such a gate dielectric 102 in the above embodiments may be formed of a silicon oxynitride, a silicon nitride, or any other suitable insulating material which may be formed in an appropriate thickness. Moreover, while the embodiments have been described in the context of a P-channel IGFET formed within an N-well disposed within a P– epitaxial layer atop a P+ substrate, it should be appreciated that such detailed process descriptions are equally applicable for N-channel IGFET fabrication, and for various other types of semiconductor substrates including a P– substrate with an N-well, an N– substrate with a P-well, and an N– epitaxial layer on an N+ substrate.

The boron implant steps described may utilize B, BF, $BF_2$, or any other source containing boron atoms such as $BF_x$, and any nitrogen implant step described may utilize atomic nitrogen (N), molecular nitrogen ($N_2$), or any other source containing nitrogen atoms. A given implant may be restricted to forming a corresponding layer within a certain region (for example, such as a P-channel gate electrode) and excluding other regions (for example, such as an N-channel gate electrode). A given implant step described above may be performed using two different implant operations, each at a different energy, to achieve a wider doping profile than achievable using a single implant. Accordingly, other embodiments, variations, and improvements not described herein are not necessarily excluded from the scope of the invention, which is defined by the following appended claims.

What is claimed is:

1. A method of fabricating a gate electrode structure for an insulated gate field effect transistor (IGFET), said method comprising:

forming a polysilicon layer on an underlying gate dielectric layer, said polysilicon layer having top and bottom surfaces, said bottom surface forming an interface with said gate dielectric layer;

implanting a nitrogen-containing material to form a nitrogen-containing diffusion-retarding barrier region within said polysilicon layer;

introducing a dopant into at least a portion of said polysilicon layer disposed between said barrier region and said top surface, said dopant introduction resulting in a greater dopant concentration immediately above said barrier region than immediately below; and removing regions of said polysilicon layer to form a gate electrode for said IGFET.

2. The method of claim 1 wherein nitrogen residing in said gate dielectric layer just below said interface has a negligible concentration.

3. The method of claim 1 wherein said removing is performed before said introducing.

4. The method of claim 1 wherein said removing is performed before said implanting.

5. The method of claim 1 wherein said implanting comprises:
  implanting a material chosen from the group consisting of elemental nitrogen (N) and molecular nitrogen ($N_2$).

6. The method of claim 1 further comprising:
  annealing said implanted nitrogen-containing material after said implanting.

7. The method of claim 1 wherein said dopant comprises boron.

8. The method of claim 1 further comprising:
  implanting a nitrogen-containing material to form a second nitrogen-containing diffusion-retarding barrier region above and spaced apart from said nitrogen-containing diffusion-retarding barrier region.

9. A method of fabricating a gate electrode structure for an insulated gate field effect transistor (IGFET), said method comprising:
  forming a polysilicon layer on an underlying gate dielectric layer, said polysilicon layer having top and bottom surfaces, said bottom surface forming an interface with said gate dielectric layer;
  implanting a nitrogen-containing material to form a nitrogen n-containing diffusion-retarding barrier region within said polysilicon layer, said barrier region separated from both said interface and said top surface;
  implanting a boron-containing material into at least a portion of said polysilicon layer between said barrier region and said top surface, resulting in a boron doping profile exhibiting a greater doping concentration immediately above said barrier region than immediately below; and
  removing regions of said polysilicon layer to form a gate electrode for said IGFET.

10. The method of claim 9 wherein said removing is performed before said implanting a boron-containing material.

11. The method of claim 9 wherein said removing is performed before said implanting a nitrogen-containing material.

12. The method of claim 9 further comprising:
  annealing said implanted nitrogen-containing material after said implanting.

* * * * *

UNITED STATES PATENT AND TRADEMARK OFFICE
CERTIFICATE OF CORRECTION

PATENT NO. : 6,380,055 B2
DATED : April 30, 2002
INVENTOR(S) : Mark I. Gardner et al.

It is certified that error appears in the above-identified patent and that said Letters Patent is hereby corrected as shown below:

Column 10,
Lines 3-4, "nitrogen n-containing" should read -- nitrogen-containing --.

Signed and Sealed this

Eleventh Day of March, 2003

JAMES E. ROGAN
*Director of the United States Patent and Trademark Office*